United States Patent
Shinohara

(10) Patent No.: US 7,052,998 B2
(45) Date of Patent: May 30, 2006

(54) METHOD OF MANUFACTURING PHOTOVOLTAIC DEVICE

(75) Inventor: Wataru Shinohara, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 90 days.

(21) Appl. No.: 10/947,297

(22) Filed: Sep. 23, 2004

(65) Prior Publication Data
US 2005/0070107 A1   Mar. 31, 2005

(30) Foreign Application Priority Data
Sep. 26, 2003   (JP) ............... 2003-334493

(51) Int. Cl.
*H01L 21/311* (2006.01)

(52) U.S. Cl. ............... 438/702; 438/719

(58) Field of Classification Search .......... 438/700, 438/702, 706, 710, 712, 719, 720, 723, 725
See application file for complete search history.

(56) References Cited

U.S. PATENT DOCUMENTS

| | | | | |
|---|---|---|---|---|
| 4,663,494 A | * | 5/1987 | Kishi et al. | 136/244 |
| 4,686,760 A | * | 8/1987 | Yamazaki | 438/16 |
| 5,688,366 A | * | 11/1997 | Ichinose et al. | 438/754 |
| 6,103,138 A | * | 8/2000 | Kondo | 252/62.3 E |
| 6,455,347 B1 | * | 9/2002 | Hiraishi et al. | 438/80 |
| 2003/0044539 A1 | * | 3/2003 | Oswald | 427/404 |
| 2003/0180983 A1 | * | 9/2003 | Oswald et al. | 438/57 |

FOREIGN PATENT DOCUMENTS

| | | |
|---|---|---|
| JP | 60-262471 | 12/1985 |
| JP | 61-214483 | 9/1986 |
| JP | 5-19990 | 3/1993 |
| JP | 5-60273 | 9/1993 |

* cited by examiner

*Primary Examiner*—Kin-Chan Chen
(74) *Attorney, Agent, or Firm*—McDermott Will & Emery LLP

(57) ABSTRACT

The present invention provides a method for manufacturing integrated-type photovoltaic devices wherein light is incident from a side opposite to its substrate. The advantage of the method is easy patterning. A first electrode film, a photoelectric conversion layer, and a second electrode film are laminated on an insulating layer of a substrate without separation to form a laminated film. A deep open groove is formed through the laminated film to the depth of the first electrode film so as to electrically separate the laminated film including the first electrode film. Two shallow open grooves are formed parallel with, but slightly away from the deep open groove, and separate the laminated film upto the second electrode film. The second electrode film having three or more open grooves are used as a mask to remove the photoelectric conversion layer by etching to expose the first electrode film at bottoms of at least one shallow open groove. An insulating member is formed by filling up the deep open groove where the first electrode film is exposed at the bottom of the groove. A conductive member extends over adjacent elements across the deep open groove.

8 Claims, 2 Drawing Sheets

METHOD OF MANUFACTURING PHOTOVOLTAIC DEVICE

The priority application Number 334493/2003 upon which this patent application is based is hereby incorporated by reference.

BACKGROUND OF THE INVENTION

1. Field of the Invention

The present invention relates to a method for manufacturing an integrated type photovoltaic device.

2. Description of Prior Art

Photovoltaic devices having a plurality of photoelectric conversion elements that are connected in series on a single substrate are well known: as integrated type photovoltaic devices. Currently there are two kinds of the integrated type photovoltaic device in practical use: a first type photovoltaic device and a second type photovoltaic device. The first type photovoltaic device has a multiplicity of photoelectric conversion elements, which are formed by laminating a light-transmitting conductive film, a photoelectric conversion layer comprising thin semiconductor films such as amorphous silicon or microcrystalline silicon to form a p-i-n junction inside, and a rear surface electrode film on an insulating and light-transmitting substrate such as a glass substrate. The light-transmitting conductive film of one photoelectric conversion element is electrically connected with the rear surface electrode film of an adjoining photoelectric conversion element. In this way, the multiplicity of photoelectric conversion elements are serially integrated. When light enters the photoelectric conversion layer through the substrate and light-transmitting conductive film of each photoelectric conversion element, photovoltaic power is generated inside the thin semiconductor films. The photovoltaic power generated in each photoelectric conversion element is added in series through the rear surface electrode film and taken out to an external device.

On the other hand, the second type photovoltaic device has a multiplicity of photoelectric conversion elements, which are formed by laminating a rear surface electrode film, a photoelectric conversion film comprising thin semiconductor films such as amorphous silicon or microcrystalline silicon to form an n-i-p junction, and a light-transmitting conductive film on a substrate having insulative surfaces, for example a metal plate such as a stainless steel plate with an insulating coating, or a plastic plate. The light-transmitting conductive film of one photoelectric conversion element is electrically connected with the rear surface electrode film of an adjoining photoelectric conversion element. In this way, the multiplicity of photoelectric conversion elements are serially integrated. When light enters the photoelectric conversion layer through the light-transmitting conductive film of each photoelectric conversion element, photovoltaic power is generated inside the thin semiconductor films. The photovoltaic power generated in each photoelectric conversion element is added in series through the rear surface electrode film and taken out to an external device.

In a manufacturing process of the integrated type photovoltaic device, techniques of energy irradiation such as laser processing have been typically used. The techniques, however, may cause thermal damages to photoelectric conversion elements. In the case where the energy irradiation is performed from a substrate side instead of the element side to prevent the damages, the substrate must be a transparent insulating substrate such as glass. The quality of the substrate heavily effects on the finished photovoltaic device. On the other hand, when integrating the elements on a metal substrate, electrode layers and a photoelectric conversion layer should be formed separately each time using a metal mask, in order to separate the photoelectric conversion elements and to ensure the electric insulating property between the photoelectric conversion elements and the metal substrate.

Japanese examined patent publication No. 19990/1993 discloses a method of manufacturing a photoelectric conversion device with a non-light-transmitting substrate, wherein a processing for integration is performed mainly from a main surface where a photoelectric conversion layer is formed.

Japanese examined patent publication No. 60273/1993 discloses a processing method of integration using a laser processing in conjunction with an etching technique.

Regarding the method of integration by laser beams disclosed in the application No. 19990/1993, however, there is a concern that some electric currents may leak because the thermal damages provide low resistance regions to the photoelectric conversion layer.

The method using the laser processing and the etching technique requires quite accurate control of laser processing; for example the processing should be stopped halfway through a thin film of 1 μm thick or less. The narrow process window is one of the problems.

The present invention is made to solve the above-described conventional problems and has an object to provide a method of manufacturing an integrated type photovoltaic device in which a rear surface electrode layer, a photoelectric conversion layer and a light-transmitting conductive layer are laminated on a substrate (the second type structure), which can be easily patterned.

SUMMARY OF THE INVENTION

The present invention provides a manufacturing method of an integrated type photovoltaic device in which a plurality of photoelectric conversion elements, each comprising a first electrode film provided on a substrate having an insulating surface, a photoelectric conversion layer comprised of semiconductor thin films and a second electrode film formed on the photoelectric conversion layer, are serially connected. The method comprises steps of (a) forming a laminated film by sequentially laminating the first electrode film, the photoelectric conversion layer, the second electrode film on the insulating surface of the substrate without being divided; (b) forming deep open grooves through the laminated films to the depth of the first electrode film so as to electrically separate the laminated film including the first electrode film; (c) forming at least one shallow open groove parallel to, but offset from the deep open groove to isolate at least the second electrode film; (d) removing some portions of the photoelectric conversion layer by etching using the second electrode film with two or more open grooves as a mask to expose the first electrode film at bottom of at least one of the open grooves; (e) forming an insulating member inside the deep open groove or at the upper part of the deep open groove so as to block the opening thereof; and (f) filling the open groove where the first electrode film is exposed with a conductive member that extends to adjacent element across the deep open groove.

The open grooves may be formed by irradiating laser beams from above the second electrode film: the deep open grooves can be formed by long-wavelength laser beams, and the shallow open grooves can be formed by short-wavelength laser beams.

Alternatively, the deep and shallow open grooves can be formed by pulsed laser beams with same energy density. The pulsed laser beams are irradiated longer in time, in other words more pulses are applied to form the deep open grooves than to form the shallow open grooves.

The etching may be a dry etching using plasma formed by $CF_4$ (carbon tetrafluoride) or a mixed gas of $CF_4$ and $O_2$ (Oxygen).

The shallow grooves whose bottom exposes the first electrode film may be formed so that two or more openings of the shallow open grooves are arranged beside an opening of the deep open groove.

The method according to the present invention does not need mask members and particular and precise controls of laser processing, thereby providing a simplified method of manufacturing integrated type photovoltaic devices at low cost.

The foregoing and other objects, features, aspects and advantages of the present invention will become more apparent from the following detailed description of the present invention when reviewed in conjunction with the accompanying drawings.

DESCRIPTION OF PREFERRED EMBODIMENTS

Figure 1:
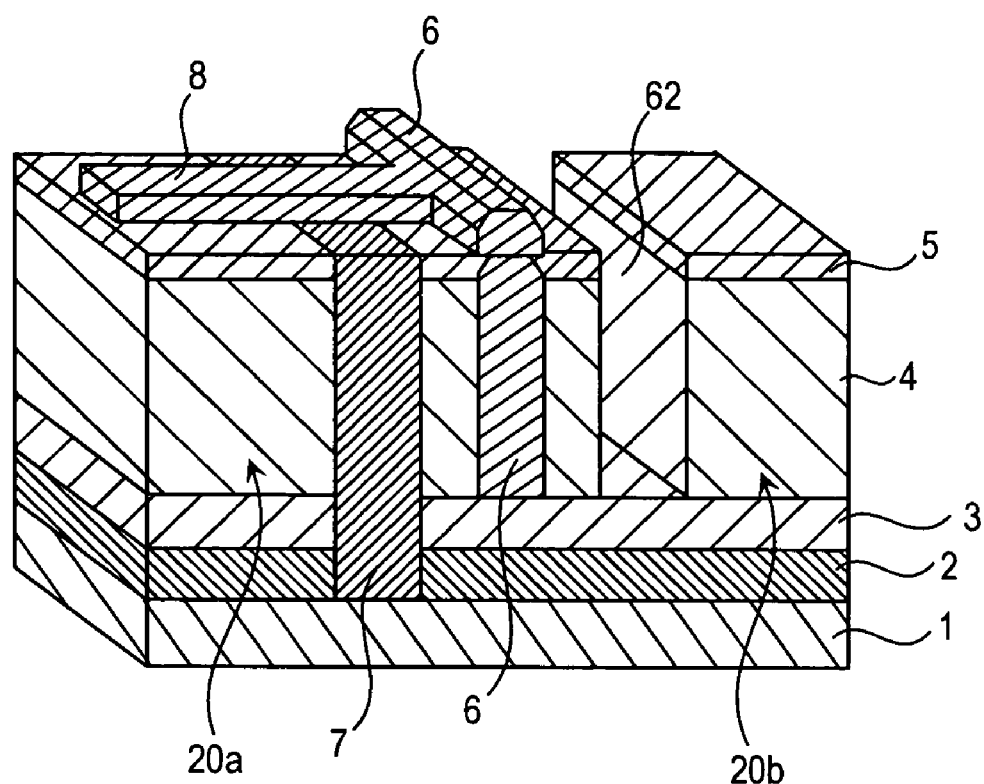
FIG. 1 is a perspective view of a relevant part of an integrated type photovoltaic device manufactured in accordance with the present invention, focusing on a part separated between adjacent photoelectric conversion elements 20a and 20b and an electrically connected part.

Reference is now made to drawings to describe the embodiments of the present invention as follows. FIG. 1 is a perspective view of a relevant part of an integrated type photovoltaic device manufactured in accordance with the present invention and focusing on a part separated between adjacent photoelectric conversion elements 20a and 20b and an electrically connected part. FIGS. 2A–2D are cross-sectional views showing each step of the manufacturing process of the integrated type photovoltaic device according to the embodiment of the present invention and focusing on a part separated between adjacent photoelectric conversion elements 20a and 20b and an electrically connected part.

A stainless steel substrate of 100 mm by 100 mm by 0.15 mm (thickness) with a polyimide insulating layer 2 of 0.01 mm in thickness applied thereon is used as a substrate 1 having an insulating surface. A first electrode 3 is formed by sputtering silver (Ag), aluminum (Al), or titanium (Ti) deposited on aluminum (Al) over the insulating layer 2 on the substrate 1. A photoelectric conversion layer 4 is then formed by depositing thin semiconductor films such as microcrystalline silicon or amorphous silicon to have an n-i-p junction through a plasma chemical vapor deposition method. Furthermore, a light-transmitting electrode film 5, or a second electrode is formed by sputtering indium tin oxide (ITO) (see FIG. 2A). In a case where the photoelectric conversion layer 4 is formed with microcrystalline silicon (μc-Si:H) using the plasma chemical vapor deposition method, for example, an n-type μc-Si:H film of about 50 nm in thickness, an intrinsic (i-type) μc-Si:H film of about 2 μm in thickness and a p-type μc-Si:H film of about 15 nm in thickness are deposited in this order on the first electrode layer 3. Each layer is formed under conditions shown in Table 1.

TABLE 1

| p, i, n conditions | Substrate temperature (° C.) | Reaction pressure (Pa) | RF power (W) | Gas flow rate (sccm) | |
| --- | --- | --- | --- | --- | --- |
| p-type layer | 160 | 100 | 50 | $SiH_4$ | 3 |
| | | | | $H_2$ | 300 |
| | | | | $B_2H_3$ | 0.05 |
| i-type layer | 200 | 150 | 50 | $SiH_4$ | 20 |
| | | | | $H_2$ | 400 |
| n-type layer | 160 | 100 | 100 | $SiH_4$ | 3 |
| | | | | $H_2$ | 100 |
| | | | | $PH_3$ | 0.2 |

Figure 2A:
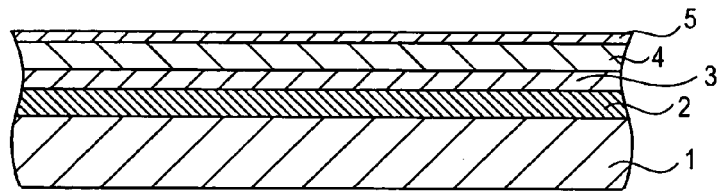
FIGS. 2A–2D are cross-sectional views showing each step of the manufacturing process of the integrated type photovoltaic device according to an embodiment of the present invention, focusing on a part separated between adjacent photoelectric conversion elements 20a and 20b and an electrically connected part.
Figure 2B:
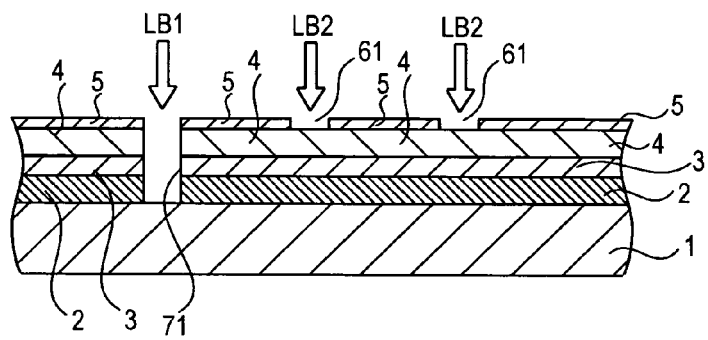
Figure 2C:
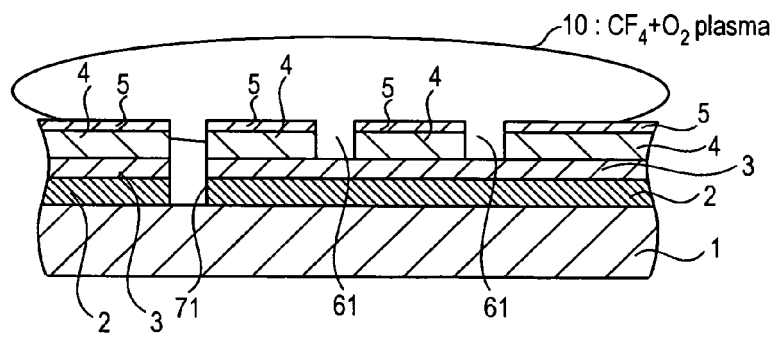
Figure 2D:
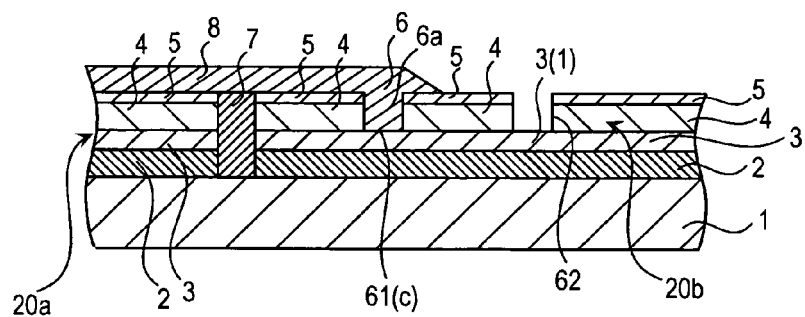

Next, as shown in FIG. 2B, a Q-switched Nd:YAG laser (LB1) is irradiated from above the light-transmitting electrode film 5 serving as a second electrode film to form a deep open groove 71 that divides the laminated films to the depth of the first electrode 3. Thus the adjacent divided films are electrically separated. The conditions of the laser irradiation to form the groove 71 are shown in Table 2. During the groove formation, some areas of the photoelectric conversion layer are thermally damaged. The damaged areas will be etched in a post-process, thereby being no longer a concern. In the present embodiment, the deep open groove 71 is formed to the depth of the insulating layer 2, which is deep enough to completely separate the first electrode films 3 of the adjacent photoelectric conversion elements 20a and 20b.

A KrF excimer laser (LB2) is then irradiated from above the light-transmitting electrode film 5 to form two shallow open grooves 61 which are located parallel to the deep open groove 71 with a space of 100 μm. The conditions of the laser irradiation to form the grooves 61 are shown in Table 3. Concurrently with the separation of the light-transmitting electrode film 5, the laser irradiation provide thermal damages and causes a surface of the foundation photoelectric conversion layer to be microcrystalline (i.e. low resistance). The micro-crystallized areas will be etched in a post-process, thereby being no longer a concern.

TABLE 2

| | |
| --- | --- |
| Laser Medium | Nd:YAG |
| Pumping Source | LD |
| Wavelength | 1064 nm |
| Power Stability | <±10% |
| Pulse Width (FWHM) | 40 nsec |
| Average Power | 8.0 W |
| Pulse Energy | 0.2 J/Pulse |
| Peak Power | 3.3 kW |
| Frequency | 40 kHz |
| Beam Diameter | 0.035 mm |
| Feed ratio | 200 mm/s |

TABLE 3

| | |
| --- | --- |
| Laser Medium | KrF |
| Wavelength | 248 nm |
| Power Stability | <±10% |
| Pulse Width (FWHM) | 80 nsec |
| Pulse Energy | 0.3 J/Pulse |

TABLE 3-continued

| | |
|---|---|
| Peak Power | 3.3 kW |
| Frequency | 5 kHz |
| Beam | 100 mm × 0.1 mm |

Using a pattern, which is the remained light-transmitting electrode films 5 after the above-described laser processing, as a mask, a dry etching is performed to expose with plasma 10 of $CF_4$ (carbon tetrafluoride)/$O_2$ (Oxygen) mixed gas. This dry etching removes the thermally damaged areas in the deep open groove 71, and the photoelectric conversion layer 4 including the micro-crystallized areas in the shallow open groove 61. Thus, surfaces of the first electrode 3 are exposed (see FIG. 2C). The conditions of the dry etching are shown in Table 4.

TABLE 4

| | |
|---|---|
| Mixing ratio | $O_2:CF_4$ = 5.0:95.0 |
| Total gas pressure | 5320 Pa |
| Gas flow rate | 400 SCCM |
| RF frequency | 13.56 MHz |
| RF power | 400 W |

It is preferable to expose with the plasma for 30 seconds or more but within 10 minutes under the above-mentioned conditions. The photoelectric conversion layer 4 may remain after the exposure of less than 30 seconds. Conversely, the sides of the photoelectric conversion layer 4 are etched after the exposure of more than 10 minutes. As a result the light-transmitting electrode film (the second electrode film) 5 is remained overhanging on the photoelectric conversion layer 4, which causes instability.

An electrically-insulating member 7 such as an insulating paste including fine powder of silicon dioxide ($SiO_2$) is filled in the deep open groove 71. In the filling process, the sticky insulating member is pressed out of a dispenser into the deep open groove 71 and sintered in an oven. This process wherein the insulating member is pressed out of the dispenser to fill into the deep open groove 71 does not need a counterpart of a mask used in screen printing, therefore mechanical damages or pin holes on the light-transmitting electrode film 5 can be prevented. The electrically-insulating member 7 surely separates adjacent elements electrically. After the separation, followings are formed. A relatively narrow fin 8 serving as a collector electrode is formed not parallel with the open groove 71, which electrically separates adjacent elements 20*a* and 20*b*. A connecting electrode portion 6*a* is formed to electrically connect with the first electrode 3 (1) of the adjacent element 20*b* through the open groove 61 adjacent to the open groove 71. A bus bar electrode 6 is then formed. These electrodes are formed with a conductive paste including conductive particle such as Ag powder. The paste is pressed out of a dispenser, and then sintered at high temperature (see FIG. 2D). In this embodiment, a conductive material for connection is filled in a middle groove 61(*c*) of the three open grooves 71, 61 and 61 to form the connecting electrode portion 6*a*. Then the fin 8 serving as a collector electrode is formed so as to cross over the deep open groove 71 and extend over the adjacent elements 20*a* and 20*b*.

By using a dispenser, which injects the paste from its nozzle, the element does not suffer mechanical damages like when using mask members in screen printing. Thus, an integrated type photovoltaic device as shown in FIG. 1 is obtained.

The change in laser beam frequency is one of the ways to form the deep open groove 71 and the shallow open grooves 61 as shown in the above-mentioned first embodiment. Another possible way is to change the number of pulse irradiation of the pulsed laser beam with same wavelength and same energy density.

The shallow open grooves 61 described in the first embodiment are formed by completely removing portions of the light-transmitting electrode film 5 but are not deep enough to remove much of portions of the photoelectric conversion layer 4. The shallow open grooves 61 may be formed deep enough to expose portions of the first electrode 3 by laser beam. Table 5 indicates the conditions of laser irradiation to form the grooves 61. The portions of the photoelectric conversion layer 4 are removed to some extent by the laser beam. Thereafter, using the remained portions of the light-transmitting electrode film 5 as masks, a dry etching is performed to expose with plasma 10 produced by the mixed gas of $CF_4$ and $O_2$. This dry etching removes the thermally damaged areas from the open grooves 71, 61 and the photoelectric conversion layer 4 including the micro-crystallized areas from the shallow open groove 61 to expose surfaces of the first electrode 3.

TABLE 5

| | |
|---|---|
| Laser Medium | KrF |
| Wavelength | 248 nm |
| Power Stability | <±10% |
| Pulse Width (FWHM) | 80 nsec |
| Pulse Energy | 9 J/Pulse |
| Peak Power | 3.3 kW |
| Frequency | 5 kHz |
| Beam | 100 mm × 3 mm |

A wet etching may be used instead of the dry etching.

The deep open groove 71, which is formed by laser beam in the first embodiment, may be also formed by a water jet machining. The water jet cutting is performed under the conditions; pressure: 10 Mpa, nozzle diameter: 0.15 mm, flow rate: 0.44 litter/min, movement speed: 0.5 m/min, distance between a nozzle and a workpiece: 40 mm.

The shallow open grooves 61 also may be formed by the water jet machining under the controlled conditions.

Furthermore, the shallow grooves take the shape of a groove to connect adjacent first electrodes 3 of the photoelectric conversion elements in the first embodiment. Instead of this, a plurality of dot-like openings may be provided along the deep open grooves to have an electric connection through the openings.

A micro crystalline silicon or amorphous silicon having an n-i-p junction inside is used as the photoelectric conversion layer 4 in the above-described embodiment. It may be replaced with the other thin semiconductor, for example, polycrystalline silicon, CdS, $CuInSe_2$ and so on.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What I claim is:

1. A method for manufacturing an integrated type photovoltaic device in which a plurality of photoelectric conversion elements, each comprising a first electrode film provided on a substrate having an insulating surface, a photoelectric conversion layer comprised of semiconductor thin films and a second electrode film formed on the photoelectric conversion layer, are serially connected, the method comprising steps of:

(a) forming a laminated film by sequentially laminating the first electrode film, the photoelectric conversion layer, the second electrode film on the insulating surface of the substrate without being divided;

(b) forming deep open grooves through the laminated films to the depth of the first electrode film so as to electrically separate the laminated film including the first electrode film;

(c) forming at least one shallow open groove parallel to, but offset from the deep open groove to isolate at least the second electrode film;

(d) removing some portions of the photoelectric conversion layer by etching using the second electrode film with two or more open grooves as a mask to expose the first electrode film at bottom of at least one of the open grooves;

(e) forming an insulating member inside the deep open groove or at the upper part of the deep open groove so as to block the opening thereof; and (f) filling the open groove where the first electrode film is exposed with a conductive member that extends to adjacent element across the deep open groove.

2. The method for manufacturing an integrated type photovoltaic device according to claim 1, wherein the open grooves are formed by irradiating laser beams from above the second electrode film.

3. The method for manufacturing an integrated type photovoltaic device according to claim 2, wherein the deep open grooves are formed by long-wavelength laser beams, while the shallow open grooves are formed by short-wavelength laser beams.

4. The method for manufacturing an integrated type photovoltaic device according to claim 2, wherein the deep and shallow open grooves are formed by pulsed laser beams with same energy density, and the pulsed laser beams are irradiated longer in time (i.e. more pulses) to form the deep open grooves than to form the shallow open grooves.

5. The method for manufacturing an integrated type photovoltaic device according to claim 1, the etching is a dry etching using plasma formed by $CF_4$ (carbon tetrafluoride).

6. The method for manufacturing an integrated type photovoltaic device according to claim 1, the etching is a dry etching using plasma formed by a mixed gas of $CF_4$ and $O_2$ (Oxygen).

7. The method for manufacturing an integrated type photovoltaic device according to claim 1, the shallow grooves whose bottom exposes the first electrode film are formed so that two or more openings of the shallow open grooves are arranged beside an opening of the deep open groove.

8. The method for manufacturing an integrated type photovoltaic device according to claim 1, the deep open grooves are formed by applying water jet machining from above the second electrode film.

* * * * *